(12) United States Patent
Scherer et al.

(10) Patent No.: US 9,952,258 B2
(45) Date of Patent: Apr. 24, 2018

(54) TRACEABLE CABLES

(71) Applicant: Mertek Industries, LLC, Austin, TX (US)

(72) Inventors: Christopher B. Scherer, Austin, TX (US); Jon Sholtis, Austin, TX (US)

(73) Assignee: MERTEK INDUSTRIES, LLC, Austin, TX (US)

( * ) Notice: Subject to any disclaimer, the term of this patent is extended or adjusted under 35 U.S.C. 154(b) by 0 days.

(21) Appl. No.: 14/354,883

(22) PCT Filed: Oct. 25, 2012

(86) PCT No.: PCT/US2012/061967
§ 371 (c)(1),
(2) Date: Apr. 28, 2014

(87) PCT Pub. No.: WO2013/063300
PCT Pub. Date: May 2, 2013

(65) Prior Publication Data
US 2014/0313042 A1    Oct. 23, 2014

Related U.S. Application Data

(60) Provisional application No. 61/553,010, filed on Oct. 28, 2011.

(51) Int. Cl.
*G08B 21/00* (2006.01)
*G01R 19/155* (2006.01)
(Continued)

(52) U.S. Cl.
CPC ......... *G01R 19/155* (2013.01); *H01R 13/641* (2013.01); *H01R 13/6675* (2013.01);
(Continued)

(58) Field of Classification Search
CPC .............. G01R 19/55; G01R 19/16538; G01R 19/16571; G01R 19/16509; B66C 15/065; H02H 3/04
(Continued)

(56) References Cited

U.S. PATENT DOCUMENTS 3,960,428 A   6/1976   Naus et al. ................... 439/315
4,761,720 A   8/1988   Solow .......................... 362/235
(Continued)

FOREIGN PATENT DOCUMENTS

WO   WO 2011-139341   11/2011

OTHER PUBLICATIONS

Search Report and Written Opinion issued in PCT/US2012/061967, dated Mar. 25, 2013.

(Continued)

*Primary Examiner* — George Bugg
*Assistant Examiner* — Anthony D Afrifa-Kyei
(74) *Attorney, Agent, or Firm* — Norton Rose Fulbright US LLP

(57) ABSTRACT

Traceable cables (e.g., networking cables, power cables, etc.). Some embodiments include a traceable power cable with a battery (e.g., that may be rechargeable from current from an external power source to which the power cable is electrically connected). Some embodiments include a traceable networking cable configured to draw power from power-over-Ethernet (POE) power sourcing equipment (PSE) even if the networking cable is not connected to a separate powered device (PD).

20 Claims, 9 Drawing Sheets

(51) Int. Cl.
*H01R 13/641* (2006.01)
*H01R 13/66* (2006.01)
*H01R 13/70* (2006.01)
*H01R 24/22* (2011.01)
*H01R 24/30* (2011.01)
*H01R 31/06* (2006.01)

(52) U.S. Cl.
CPC ............ *H01R 13/70* (2013.01); *H01R 24/22* (2013.01); *H01R 24/30* (2013.01); *H01R 31/06* (2013.01)

(58) Field of Classification Search
USPC ................... 340/660, 664; 338/13; 307/152
See application file for complete search history.

(56) References Cited

U.S. PATENT DOCUMENTS

| | | | |
|---|---|---|---|
| 4,837,488 A | 6/1989 | Donahue | 324/66 |
| 5,159,316 A | 10/1992 | Lazzara | 340/568.2 |
| 5,741,152 A | 4/1998 | Boutros | 439/490 |
| 5,764,043 A | 6/1998 | Czosnowski et al. | 324/66 |
| 6,244,908 B1 | 6/2001 | Hammond et al. | 439/676 |
| 6,394,853 B1 | 5/2002 | Hammond et al. | 439/676 |
| 6,532,328 B1 | 3/2003 | Kline | 385/101 |
| 6,577,243 B1 | 6/2003 | Dannenmann et al. | 340/815.45 |
| 6,710,254 B2 | 3/2004 | Yueh | 174/135 |
| 6,790,096 B2 | 9/2004 | Lin | 439/676 |
| 6,798,183 B2 | 9/2004 | Bohley et al. | 324/66 |
| 6,975,242 B2 | 12/2005 | Dannenmann et al. | 340/815.45 |
| 7,049,937 B1* | 5/2006 | Zweig | H01R 13/641 324/66 |
| 7,221,284 B2 | 5/2007 | Scherer et al. | 640/815.45 |
| 7,299,305 B2* | 11/2007 | Kim | G06F 3/0605 710/10 |
| 2002/0031955 A1 | 3/2002 | Schmidt et al. | 439/676 |
| 2003/0222786 A1* | 12/2003 | Dannenmann | H01R 13/641 340/815.45 |
| 2003/0234729 A1 | 12/2003 | Shen | 640/664 |
| 2004/0038564 A1 | 2/2004 | Yan | 439/76.1 |
| 2004/0160774 A1 | 8/2004 | Lionetti | 362/253 |
| 2005/0124209 A1* | 6/2005 | Currie | H01R 13/7172 439/490 |
| 2005/0275412 A1 | 12/2005 | Kwong et al. | 324/542 |
| 2006/0232385 A1* | 10/2006 | Scherer | G01R 31/045 340/286.02 |
| 2008/0099313 A1 | 5/2008 | Dhir | 200/51.12 |
| 2008/0102689 A1 | 5/2008 | Dhir | 439/490 |
| 2009/0022306 A1* | 1/2009 | Wang | H04M 19/001 379/413 |

OTHER PUBLICATIONS

Office Action Issued in Australian Patent Application No. 2012323998, dated Jun. 30, 2014.
Office Action issued in Australian Patent Application No. 2012323998, dated Mar. 2, 2016.

* cited by examiner

TRACEABLE CABLES

CROSS-REFERENCE TO RELATED APPLICATIONS

This application is a national phase application under 35 U.S.C. § 371 of International Application No. PCT/US2012/061967 filed 25 Oct. 2012, which claims priority to U.S. Provisional Patent Application No. 61/553,010, filed Oct. 28, 2011, the contents of both of which applications are incorporated by reference in its entirety their entireties.

BACKGROUND

1. Field of the Invention

The present invention relates generally to power and/or networking cables, and more particularly, but not by way of limitation, to power and/or traceable networking cables.

2. Description of Related Art

An example of a power cable with a light for indicating the presence of power is disclosed in U.S. patent application Ser. No. 10/863,209, filed Jun. 9, 2004, and published as Pub. No. U.S. 2005/0275412. An example of a power cable with a loading indication and warning system is disclosed in U.S. patent application Ser. No. 10/064,578, filed Jul. 29, 2002, and published as Pub. No. U.S. 2003/0234729. An example of power a cable with a location-indicating function is disclosed in U.S. Pat. No. 6,710,254. Examples of traceable networking cables are disclosed in U.S. Pat. No. 7,221,284, and U.S. Pat. No. 6,577,243.

SUMMARY

This disclosure includes embodiments of networking cables and power cables.

Some embodiments of the present power cables comprise: a power cable having a first end, a second end, and two or more conductors in a flexible sheath between the first end and the second end; a male connector hood on the first end of the power cable; a female connector hood on the second end of the power cable; an electric power source configured to be incorporated into at least one of the connector hoods; an electrically activated telltale incorporated into at least one of the connector hoods; and a manually operated switch incorporated into at least one of the connector hoods and configured to activate the telltale by initiating electrical communication between the electric power source, at least one of the two or more conductors, and the telltale.

In some embodiments of the present power cables, the electric power source comprises a battery. Some embodiments comprise: a charging circuit coupled to the two or more conductors and configured such that if the power cable is coupled to an external electric power source, the charging circuit can communicate electric current from the external electric power source to the power source. Some embodiments comprise a second electrically activated telltale incorporated into the other of the connector hoods; where the manually operated switch is configured to activate both telltales by initiating electrical communication between the electric power source, at least one of the conductors, and the telltale.

Some embodiments of the present power cables further comprise: a controller coupled to the electric power source, the switch, and the telltale. In some embodiments, the controller is configured to: activate the telltale for a predetermined amount of time responsive to the switch being operated if the telltale is not active; and inactivate the telltale responsive to the switch being operated during a predetermined amount of time in which the telltale is activated. In some embodiments, the controller is configured to: activate the telltale for a first predetermined amount of time responsive to the switch being operated in a first manner if the telltale is not active; and activate the telltale for a second predetermined amount of time responsive to the switch being operated in a second manner if the telltale is not active. In some embodiments, the controller is configured to activate the telltale if the voltage of the battery falls below a threshold voltage. In some embodiments, the electric power source comprises a battery, and the controller is configured such that if the power cable is coupled to an external electric power source, the controller can direct electrical current from the external power source to the battery. In some embodiments, the controller is configured to direct electrical current from the external power source to the battery if the voltage of the battery falls below a threshold voltage. In some embodiments, the controller is incorporated into one of the connector hoods. In some embodiments, the electrically activated telltale is configured to emit an audio or visual signal if activated. In some embodiments, the electrically activated telltale comprises one or more items selected from the group consisting of a light emitting diode, an incandescent light bulb, and a liquid crystal visual indicator.

Some embodiments of the present methods (e.g., methods of manufacturing a power cord cable) can comprise: overmolding at least a portion of a connector hood onto an end of any embodiment of the present power cord cables. Such overmolding may be accomplished using any technique known in the art. Some embodiments of the present methods (e.g., methods of coupling a power cord cable to a power source and/or a powered device) can comprise: coupling a connector hood of any embodiment of the present power cables to a power source (e.g., a wall plug) and/or a powered device (e.g., a computer, server, printer, etc.).

Some embodiments of the present networking cables comprise: a plurality of conductors in a flexible sheath having a first end and a second end, the plurality of conductors comprising a plurality of conductor wire pairs; a connector hood on each end of the flexible sheath; an electric power source configured to be incorporated into at least one of the connector hoods; an electrically activated telltale incorporated into at least one of the connector hoods; a manually operated switch incorporated into at least one of the connector hoods and configured to activate the telltale by initiating electrical communication between the electric power source and the telltale; and a resistor incorporated into at least one of the connector hoods, the resistor electrically connected to at least one of the conductor wire pairs such that if the cable is electrically connected to power-over-Ethernet (POE) power sourcing equipment (PSE), the POE PSE will deliver electric power to the cable even if the cable is not also electrically connected to a separate POE powered device (PD).

In some embodiments of the present networking cables, the plurality of conductors further comprises at least one indicator wire, and the switch is configured to activate the telltale by initiating electrical communication between the electric power source and the telltale via the at least one indicator wire. Some embodiments comprise a charging circuit coupled to the at least one of the conductor wire pairs and configured such that if the cable is electrically connected to POE PSE, the charging circuit can communicate electric current from the POE PSE to the electric power source. In some embodiments, the electric power source comprises a rechargeable battery. Some embodiments comprise: a second electrically activated telltale incorporated into another of the connector hoods; where the manually operated switch is configured to activate both telltales by initiating electrical communication between the electric power source, at least one of the conductors, and the telltale.

Some embodiments of the present networking cables further comprise: a controller coupled to the electric power source, the switch, and the telltale. In some embodiments, the controller is configured to: activate the telltale for a predetermined amount of time responsive to the switch being operated if the telltale is not active; and inactivate the telltale responsive to the switch being operated during a predetermined amount of time in which the telltale is activated. In some embodiments, the controller is configured to: activate the telltale for a first predetermined amount of time responsive to the switch being operated in a first manner if the telltale is not active; and activate the telltale for a second predetermined amount of time responsive to the switch being operated in a second manner if the telltale is not active. In some embodiments, the controller is configured to activate the telltale if the voltage of the battery falls below a threshold voltage. In some embodiments, activating the telltale comprises pulsing power to the electrically activated telltale. In some embodiments, the resistor is included in a printed circuit board (PCB) to which the controller is coupled. In some embodiments, the electric power source comprises a battery, and the controller is configured such that if the cable is electrically connected to POE PSE, the controller can direct electrical current from the POE PSE to the battery. In some embodiments, the controller is configured to direct electrical current from the POE PSE to the battery if the voltage of the battery falls below a threshold voltage. In some embodiments, the controllers is incorporated into one of the connector hoods. In some embodiments, the electrically activated telltale is configured to emit an audio or visual signal if activated. In some embodiments, the electrically activated telltale comprises one or more items selected from the group consisting of: a light emitting diode, an incandescent light bulb, and a liquid crystal visual indicator.

Some embodiments of the present networking cables comprise: a separator mechanism incorporated into at least one of the connector hoods to separate at least one of the plurality of conductors from at least one of the other plurality of conducts to prevent crosstalk between the separated conductors.

Some embodiments of the present methods (e.g., methods of manufacturing a networking cable) can comprise: overmolding at least a portion of a connector hood onto an end of any embodiment of the present networking cables. Such overmolding may be accomplished using any technique known in the art. Some embodiments of the present methods (e.g., methods of using a networking cable) can comprise: coupling a connector hood of any embodiment of the present networking cables to a networking connection (e.g., a jack in communication with a POE PSE, etc.) and/or a powered device (e.g., a POE-powered telephone, etc.).

Any embodiment of any of the present cables, systems, apparatuses, and methods can consist of or consist essentially of—rather than comprise/include/contain/have—any of the described steps, elements, and/or features. Thus, in any of the claims, the term "consisting of" or "consisting essentially of" can be substituted for any of the open-ended linking verbs recited above, in order to change the scope of a given claim from what it would otherwise be using the open-ended linking verb.

Details associated with the embodiments described above and others are presented below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are drawn to scale (unless otherwise noted), meaning the sizes of the depicted elements are accurate relative to each other for at least the embodiment depicted in the figures.

DESCRIPTION OF ILLUSTRATIVE EMBODIMENTS

The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system or apparatus that "comprises," "has," "includes" or "contains" one or more elements possesses those one or more elements, but is not limited to possessing only those elements. Likewise, a method that "comprises," "has,"

"includes" or "contains" one or more steps possesses those one or more steps, but is not limited to possessing only those one or more steps.

Further, a structure (e.g., a component of an apparatus, such as a cable) that is configured in a certain way is configured in at least that way, but it can also be configured in other ways than those specifically described.

Figure 1:
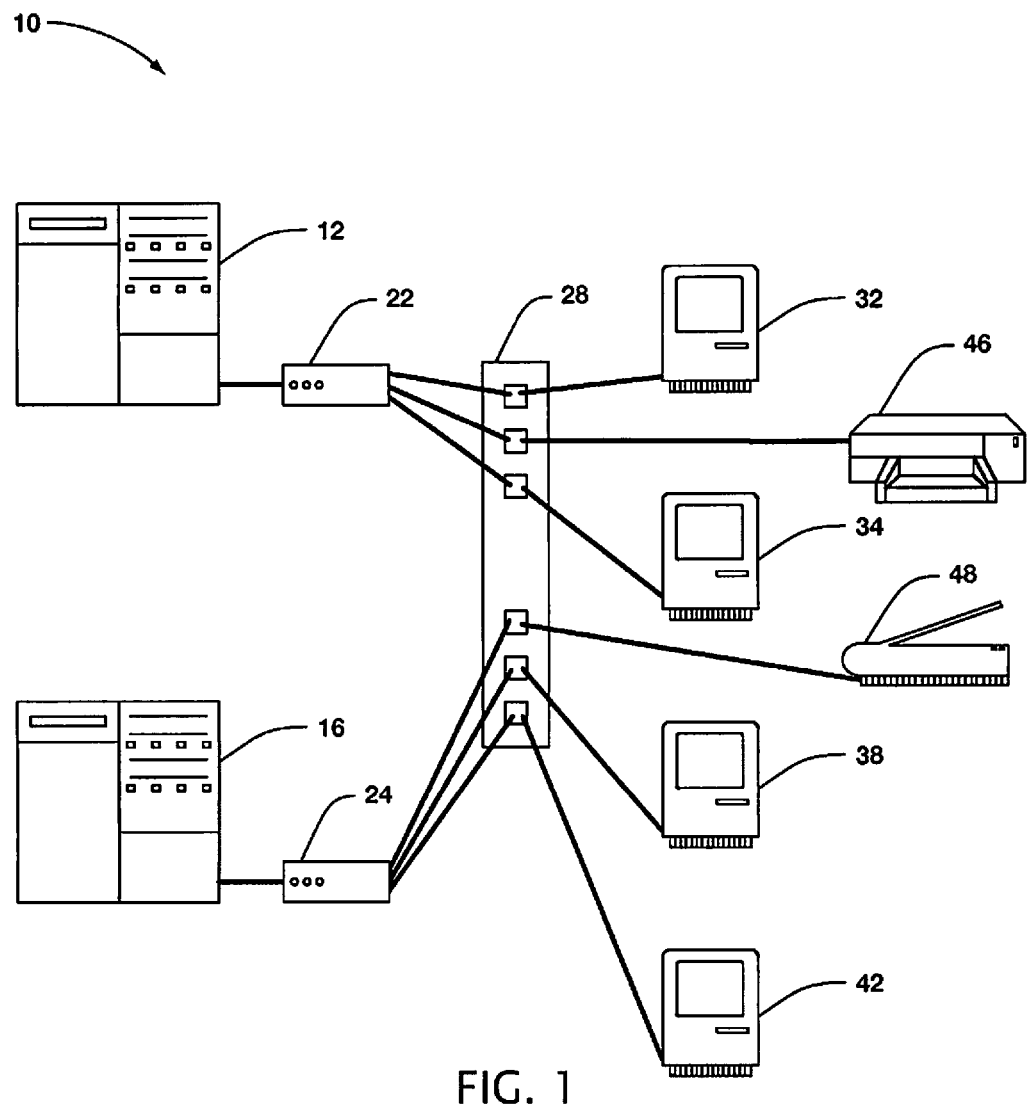
FIG. 1 is a schematic view of a networked computer environment.

Referring now to the drawings, and more particularly to FIG. 1, shown and designated by reference numeral 10 is an example of a networked environment that includes servers, computers, hubs, peripheral devices, and a cable panel. In the example, shown computers 32, 34, 38, and 42 are each connected by networking cables to a cable panel 28. The computers can be at multiple locations. Also attached to panel 28 by networking cables are peripheral devices such as printer 46 and scanner 48. Panel 28 is often located at a central room where service personnel can access it. From panel 28, multiple computers and peripheral devices are often linked by networked cables to hubs such as 22 and 24, which may be connected to servers 12 and 16. Multiple servers and hubs may be housed in a room. Various protocols (e.g., Ethernet) can be used to support data transfer between computers and servers. The example shown is relatively a small network, and networks may often be much larger. In addition to the devices shown in FIG. 1, networks can include, for example, other electronic devices such as workstations, switches, tape drives, storage devices, telephone switches, VOIP devices, routers, and/or any other device that may be connected to a network (e.g., a camera). With large networks, the total number of networking cables may be very large, and routine maintenance functions (e.g., the addition or change of computers) can require significant time and manpower to trace connections throughout the network.

In some embodiments, panel 28 may also represent an external power source that provides power to the various devices (32 34, 36, 38, 42, 46, 48), and at least some of the cables extending between the various devices and panel 28 may comprise power cables (e.g., AC power cables).

Figure 2:
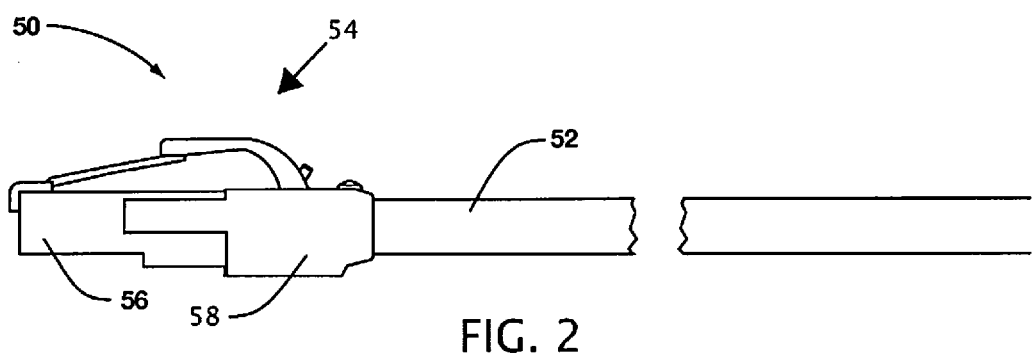
FIG. 2 is a side view of an end of one embodiment of the present networking cables.

FIG. 2 depicts an embodiment 50 of the present networking cables that may be used in the networked environment of FIG. 1. Cable 52, as used in networking applications, is typically composed of a plurality of insulated twisted conductor wire pairs encased in a flexible outer sheath (e.g., an outer cover sheath). The number of twisted conductor wire pairs (e.g., four conductor pairs with eight conductor wires, five conductor pairs with then conductor wires, etc.) can vary depending on the application. In the embodiment shown, a connector assembly or hood 54 comprises a connector 56 coupled to a boot 58, and the connector hood is coupled to an end of cable 52. An example of a typical connector 56 used for Ethernet networking applications is an RJ-45 or 8P8C connector, an eight-wire or eight-pin connector commonly used in networking computers. Another example of a connector 56 that may be used is an RJ-50 or 10P10C connector, a ten-conductor or ten-pin connector. Boot 58 may, for example, be overmolded onto connector 56 and/or cable 52. The overall connecter (connector plus boot) will be referred to as the connector hood in this description and in the appended claims.

Some well known standards for networking cables that may be included in cable 52 include Categories: 5 (which generally includes four insulated twisted copper wires encased in a flexible outer jacket layer), 5A, 5E, 6 (e.g., for Gigabit Ethernet and/or other network protocols). Later standards (e.g., Cat-6) are often backward compatible with earlier standards (e.g., CAT 5, CAT 3). Relative to Cat-5, Cat-6 specifications are generally more stringent for crosstalk and system noise. Cat-6, for example, provides performance of up to 250 MHz, and may be suitable for 10BASE-T, 100BASE-TX (Fast Ethernet), 1000BASE-T/1000BASE-TX (Gigabit Ethernet) and 10GBASE-T (10-Gigabit Ethernet). Cat-6 has a relatively lower maximum length when used for 10GBASE-T. Cat-6A cable, or Augmented Cat-6, is characterized for 500 MHz and has further improved alien crosstalk characteristics, allowing 10GBASE-T to be run for the same maximum cable length as other protocols.

Several other standards are in use, and may be used in embodiments of the present traceable networking cables. In some embodiments, one or more (e.g., two in a conductor wire pair) additional conductor wires (which may be referred to as tracer wires or indicator wires) can be added to or included in a networking cable (e.g., a Cat-5 or Cat-6 cable) such that the additional conductor wire(s) are used in the tracing function described herein. For example, the use of a cable 52 with ten wires or conductors with eight-wire RJ-45 connectors allows one of the five conductor-wire pairs to be used as a continuous continuity path between electrically activated telltales (e.g., light) at the end of the cable. Cables, conductor wires, conductor wire pairs, and/or conductors in the present embodiments may be coaxial, twin-axial, twisted, untwisted, shielded, unshielded, and/or bonded, as is known in the art.

Figure 3:
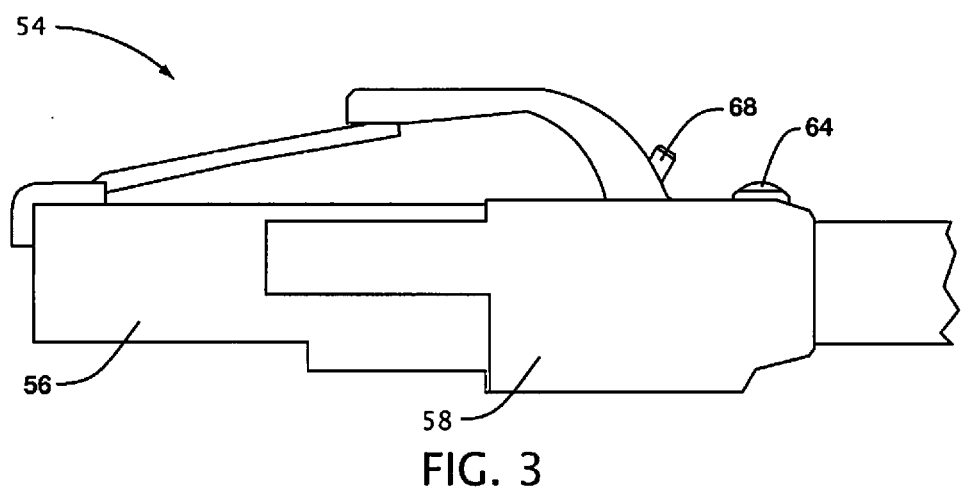
FIG. 3 is an enlarged side view of the end of FIG. 2.

FIG. 3 depicts an enlarged view of connector assembly or hood 54. In the embodiment shown, cable 50 comprises an electrically activated telltale 64 (which can be configured to produce a visual and/or an audio signal) incorporated into at least one of the connector hoods (e.g., hood 54, as shown). In the embodiment shown, telltale 64 is incorporated into a rear or proximal end of boot 58 near the cable. As used in this disclosure and the claims, an electrically activated telltale is any electrically triggered device that emits a visual or audio signal that can be detected by a human. One example of a suitable telltale is a light emitting diode (LED), but may alternatively or additionally include one or more other visual indicators (e.g., an incandescent or conventional light bulb, a liquid crystal visual indicator, etc.). In the embodiment shown, the cable also includes a button 68 that is configured to be manually pressed to engage a manual switch (72) incorporated into at least one of the connector hoods and configured to activate the telltale by initiating electrical communication between the electric power source and the telltale (e.g., via one or more of the conductors, such as, for example, a conductor wire, a conductor wire pair, an indicator wire, and/or indicator wire pair). For example, the switch can complete an indicator circuit that includes an LED to cause the LED to flash repeatedly for a predetermined time. In some embodiments, the indicator circuit includes the indicator wire or wire pair that runs the complete length of the networking cable. It is important to note that in some embodiments, the present networking cables include the hood of FIG. 2, on a first or "left" end of the networking cable, and a second hood (e.g., substantially similar to hood 54) on the second or "right" end of the cable (e.g., such that the two hoods are in electrical communication connection via a conductor wire, a conductor wire pair, an indicator wire, and/or indicator wire pair). For example, in an embodiment with a connector hood at each end of the cable, where each connector hood includes a switch and a telltale, the operation of either switch can activate both telltales if the telltales are not activated, or the operation of either switch can deactivate both telltales if the telltales are activated, as described in more detail below.

Telltale 64 and button 68 are shown in one suitable configuration relative to hood 54; in other embodiments, telltale 64 and/or button 68 can be incorporated into hood at any suitable position in hood 54. In other embodiments, the present cables can include connector hoods spaced apart from the terminal or end connectors of the cable. For example, some embodiments of the present cables can include a connector hood spaced inward relative to an end of the cable (e.g., by 1, 2, 3, 4, 5, or more inches), and the inwardly-spaced connector hood can include one or more of the tracing features or elements (e.g., a button, telltale, etc.) described in this disclosure.

Figure 4:
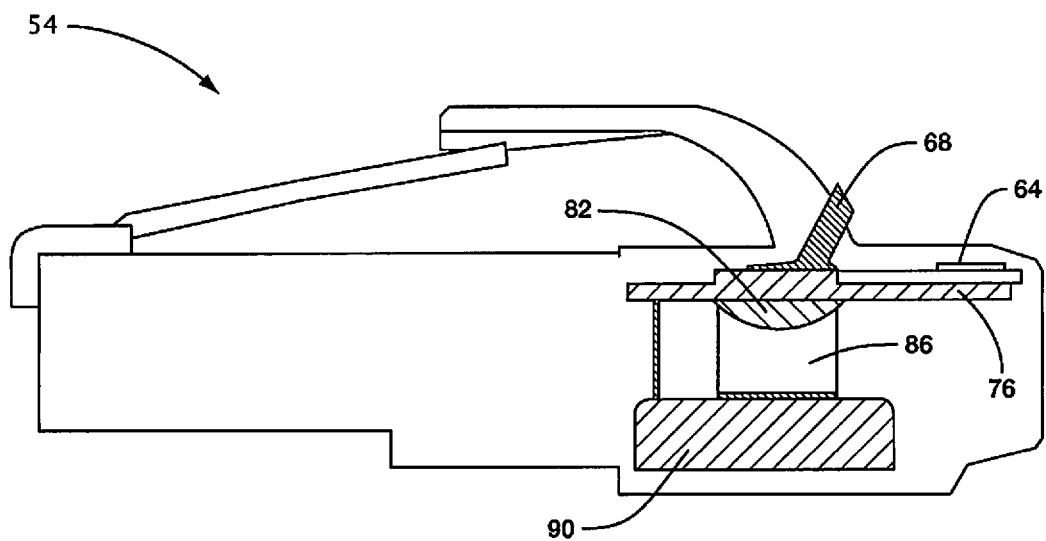
FIG. 4 is a cross-sectional view of a control unit of the cable of FIG. 2.
Figure 5:
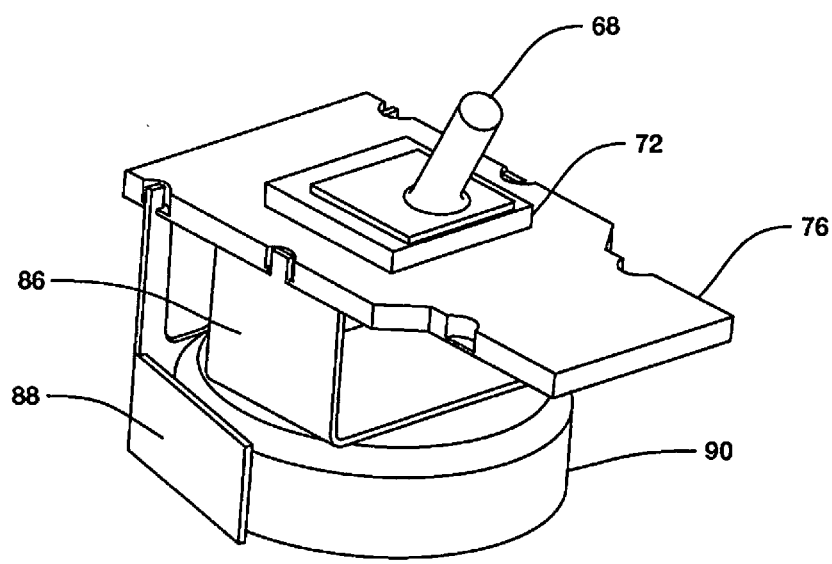
FIG. 5 is a perspective view of the control unit of FIG. 4.

Referring now to FIGS. 4 and 5, FIG. 4 depicts a cross-sectional side view of what may be referred to as a control unit of at least some internal components of the present cables, with the outline of the overall hood 54 shown for reference, and FIG. 5 depicts a perspective view of the control unit of FIG. 4. In the embodiment shown, button 68 is coupled (e.g., connected physically) to a switch 72 that, when manually engaged, completes an electrical circuit that powers telltale 64. In the embodiment shown, the cable comprises a printed circuit board (PCB) 76 to which switch 72 is coupled, and a controller 82 (e.g., integrated circuit) configured to have at least some of the functionality described in this disclosure. In some embodiments, the cable comprises more than one controller, each configured to provide at least a part of the functionality of the respective embodiment. In the embodiment shown, PCB 76 is coupled (e.g., such that an electrical connection or circuit can be completed through PCB 76) via a first or positive connection 86 and a second or negative connection 88. PCB 76 can be configured to include (e.g., via one or more appropriate conductive traces) a complete and/or completable (e.g., via switch 72) electrical circuit between telltale 64, switch 72, integrated circuit 82, and power source 90. Embodiments with two connector hoods may include a controller and/or battery in each of the two connector hoods (e.g., with one controller a "master" and one controller a "slave"), or can include a single controller and/or a single battery. For example, in some embodiments, the cable includes a single controller and a single battery in one of the two connection hoods, but includes a switch and telltale in each of the two connection hoods, such that depressing a switch at either end of the cable activates the telltales at both ends of the cable. In such embodiments, a similar PCB may be used in the hood without a controller or power source to provide the circuit between the switch and telltale.

In various embodiments of the present cables, the controller can be configured to include various functions. In some embodiments, the controller is configured to: activate the telltale for a predetermined amount of time (e.g., equal to, greater than, or between any of: 10, 15, 20, or 30 seconds) responsive to the switch being operated if (or when) the telltale is not active; and inactivate (or stop activation of) the telltale responsive to the switch being operated if the telltale is activated (e.g., during the predetermined amount of time during which the telltale is activated). In some embodiments, the controller is configured to: activate the telltale for a first predetermined amount of time (e.g., equal to, greater than, or between any of: 10, 15, 20, or 30 seconds) responsive to the switch being operated in a first manner (e.g., depressed and released once) if the telltale is not active; and activate the telltale for a second predetermined amount of time (e.g., equal to, greater than, or between any of: 30, 40, 50, or 60 seconds) responsive to the switch being operated in a second manner (e.g., depressed and released twice within 2 seconds, depressed and held down for 2 seconds or more, etc.) if the telltale is not active. In such embodiments (in which the controller is configured to activate the telltale for one of two predetermined periods of time depending on the manner in which the switch is operated), the circuit may include multiple timing resistors (136), as described below. In some embodiments, the controller is configured to activate the telltale (e.g., differently than the way in which the telltale is activated responsive to the switch being operated) if the voltage of the battery falls below a threshold voltage (e.g., 1.8V for a 3V battery). For example, in some embodiments, the controller is configured to turn the telltale on continuously, or to pulse the telltale intermittently at a rate that is slower than the rate at which the telltale is pulsed responsive to operation of the switch, if the battery voltage falls below the threshold voltage.

In some embodiments, an integrated circuit is used that provides several options for an end user. For example, an integrated circuit can be configured to activate the telltales to a) flash for 20 seconds responsive to a button being pushed once, and then shut off automatically, b) flash for 40 seconds responsive to a button being held down for 3 seconds, and then shut off automatically, c) shut off responsive to a button being pushed once on either end while the telltales are active, and d) flash indefinitely responsive to a button being pressed 3 times in a row, and shut off responsive to a button being pushed once.

Figure 6:
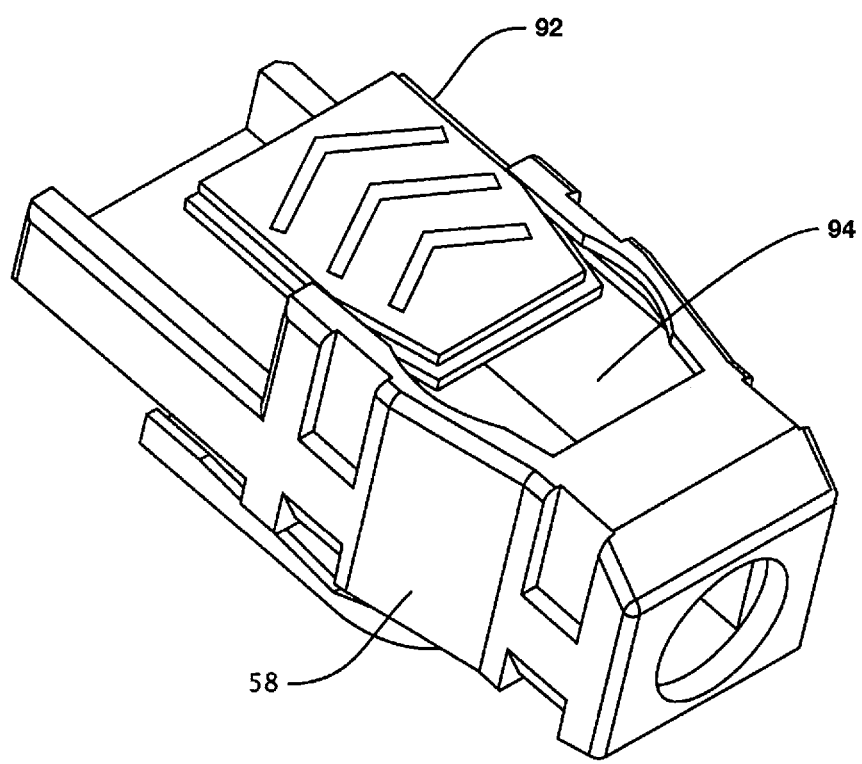
FIG. 6 is a lower perspective view of a portion of the cable of FIG. 2.

FIG. 6 depicts a lower perspective view of boot 58. In the embodiment shown, boot 58 is configured for an embodiment in which power source 90 is a battery. For example, in the embodiment shown, boot 58 comprises a door 92 configured to be moved to an open position to expose a battery port 94 configured to receive the battery (e.g., into which the battery can be inserted). A variety of batteries can be used for embodiments of the present cables. For example, for the circuit components discussed above, a CR927 lithium or other 3-volt battery can be used. A number of similar batteries are available from a variety of manufacturers, and any battery can be used that permits the functionality described in this disclosure.

Figure 7:
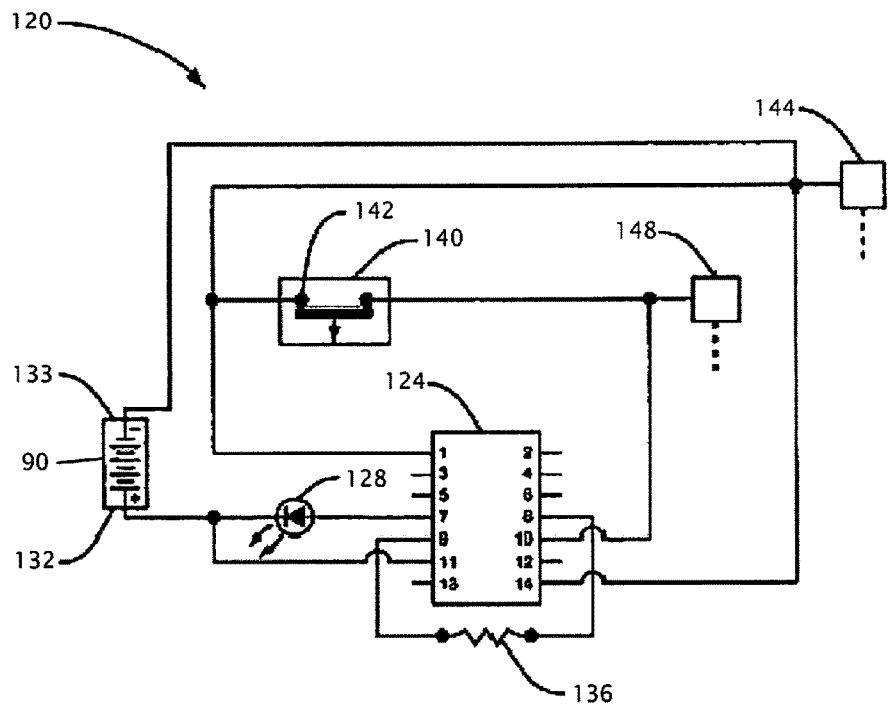
FIG. 7 is a schematic view of the control unit of FIG. 4.

FIG. 7 depicts a schematic of one embodiment 120 of a direct current (DC) circuit for a connection hood of the present cables. An integrated circuit 124 is shown as an example of a controller 82 (FIG. 4). A light emitting diode (LED) 128 is shown as an example of a telltale 64. In the embodiment shown, LED 128 is in electrical connection with pin 7 of chip 124 and a first or positive connection 132 of battery 90, as well as with pin 11 of chip 124 via the connection between LED 128 and battery 90. Resistor 136 is connected across pins 8 and 9 of chip 124, and is configured to determine the frequency and duration of power pulses sent to LED 128. For example with an X1622 IC chip (available from Fulikai Electronic Technologies (China)), a 220-ohm resistor 136 will deliver pulses that cause LED 128 to blink for about 19 seconds. A smaller resistor (resistor with lower resistance) will increase the frequency of blinking and shorten the total duration of blinking. In embodiments in which the controller (e.g., IC chip) is configured to activate the telltale(s) for one of two or more predetermined times depending on the manner in which a switch is operated, the circuit can include two or more resistors 136 (e.g., each with a different resistance) to provide different durations of activation for the telltale(s). A switch 140 is shown as an example of switch 72 (FIG. 5) is operable to start the pulsing of power to the LED for the prescribed or predetermined amount of time. The ground or negative side 133 of battery 90 is connected to a first side 142 of switch 140, as well as pins 1 and 14 of integrated circuit 124. Finally, circuit 120 is connected to an indicator wire pair with conductors 144 and 148. Indicator wire pair 144 and 148 can connect to a second circuit in the second connector hood, and as discussed above, the second circuit can be identical to or may differ from circuit 120, as long as when a switch (e.g., 140) on either end is engaged, both telltales are activated.

Figure 8:
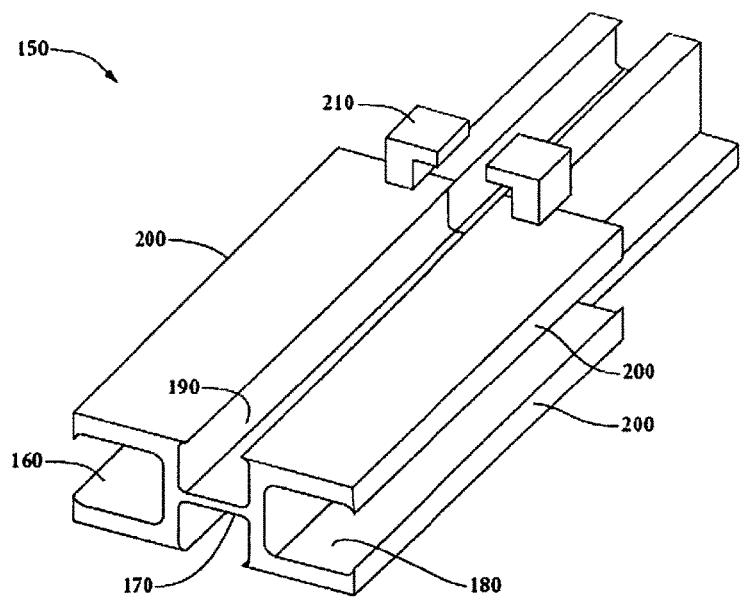
FIG. 8 is a view of a separator portion of the cable of FIG. 2.

FIG. 8 illustrates an embodiment 150 of a separator for reducing crosstalk between conductor wire pairs. In the embodiment shown, separator 150 is sized to fit completely within connector hood 54. Separator 150 can comprise (e.g., can be molded from) a non-conductive material, and can include a plurality of channels 160, 170, 180, and 190 each for a different one of four conductive (e.g., twisted) wire pairs (e.g., from cable 52). In the embodiment shown, separator 150 is configured to maintain separation between wire pairs through the length of connector hood 54 (e.g., between the exposed ends of the wires in the connector and an end of outer cable insulation that is stripped to connect the cable to the hood 54). In some embodiments, one of the channels (e.g., channel 180) may carry the indicator wire or wire pair in addition to the respective conductor wire pair.

Figure 9:
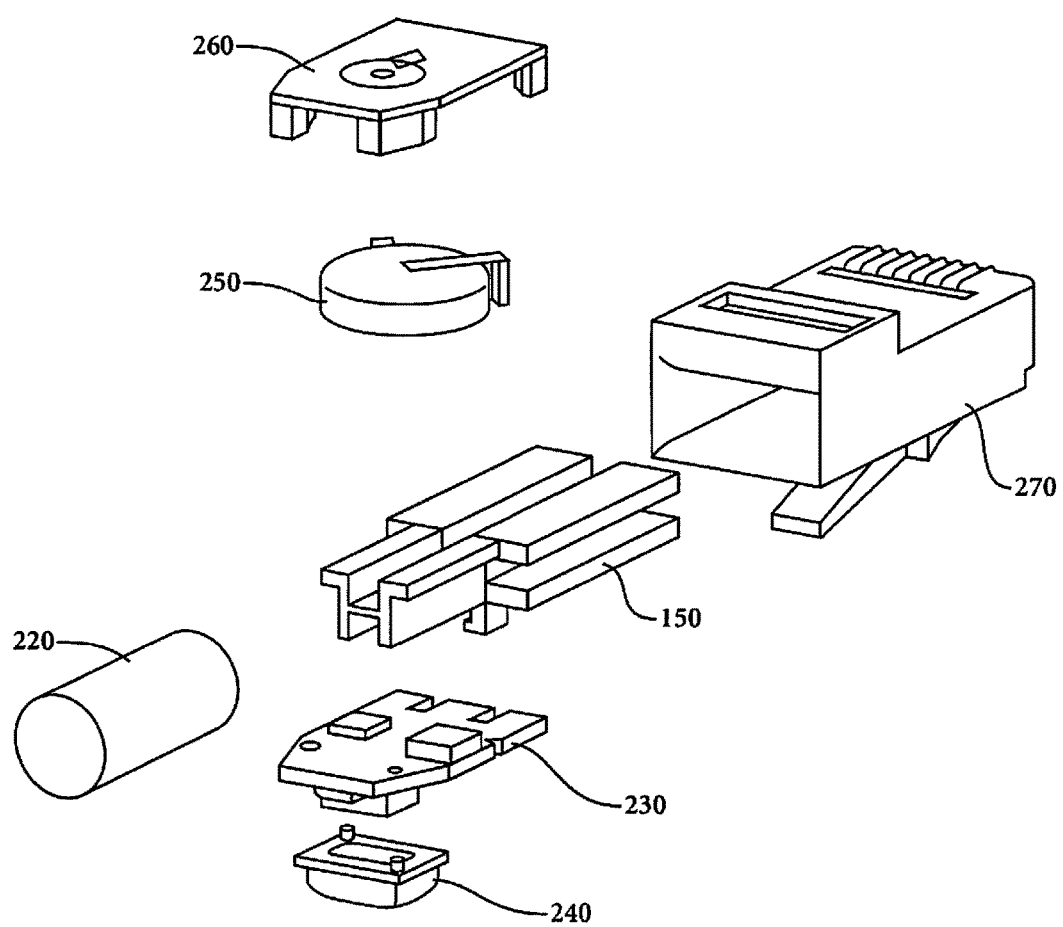
FIG. 9 is an exploded perspective view of a portion of the cable of FIG. 2.

In the embodiment shown, separator 150 is configured to allow or permit the inclusion of a suitable circuit (e.g., 120) within connector hood 54 while meeting the requirements for minimal crosstalk required by Cat-6 and/or Cat-6A standards. For example, FIG. 9 illustrates an exploded view of one embodiment of the present cables that includes separator 150. As described above, separator 150 accepts and separates four twisted wire pairs (not shown) from cable 220, as described above (e.g., the four conductor wire pairs and indicator wire or wire pair can respectively be disposed or channeled in the four channels of separator 150). A printed circuit board (PCB) 230 (which may be similar to PCB 76), containing or coupled to the electronics (e.g., as described for circuit 120) for the tracer functionality can be disposed below and/or coupled to separator 150 (and connected to the indicator wire or wire pair). A button 240 (e.g., similar to button 68) can be disposed below PCB 230 such that button 240 can be depressed to operate the switch. An electric power source 250 (similar to power source 90, e.g., a battery) can be disposed between separator 150 and a power source cover 260. In the embodiment shown, the complete assembly is located inside the connector hood (connector 270 similar to connector 56, and a boot similar to boot 58).

In some embodiments, the power supply can comprise one or more components alternative to or in addition to a battery. For example, the power source can comprise one or more capacitors. In some embodiments, the present networking cables are configured such that if the cable is electrically connected to power-over-Ethernet (POE) power sourcing equipment (PSE), the PSE will deliver electric power to the cable even if the cable is not also electrically-connected to a separate POE-powered device (PD). For example, in some embodiments, the cable can comprise a resistor (which may be referred to as a POE resistor) incorporated into at least one of the connector hoods, the resistor being electrically connected to at least one of the conductor wire pairs in the cable (e.g., between connections 144 and 148 in circuit 120) such that if the cable is electrically connected to POE PSE, the PSE will deliver electric power to the cable even if the cable is not also electrically connected to a separate POE PD. Such a resistor can be of any suitable resistance (e.g., 25 kΩ) as required by one or more POE standards.

POE delivery generally includes a "handshake" or initiation process with an exchange of signals between the PSE and a PSD in which the PSE verifies that the PD is standard compliant and determines the maximum amount of power to be delivered to the PD. In general, once the handshake is completed and the PSE begins delivering power to the PD, the PSE will stop delivering power to the PD if the PD stops drawing power for a predetermined period of time (e.g., 100 seconds). In embodiments in which the cable is configured to demand POE power even if not connected to an external PD, the cable can include any suitable configuration capable of performing the initial "handshake" or initiation process with the PSE. For example, in some embodiments, the cable can be configured to demand an initial burst or relatively higher amount of power to set the maximum power level from the PSE relatively high (e.g., 1 W) and then maintain at least a minimal or relatively lower power demand (e.g., 0.01 W) continuously to ensure that the PSE does not stop delivering power to the cable. For example, in embodiments with a battery, the cable can be configured to (e.g., after the handshake process) only demand power above the minimal power level from the PSE if the battery is below a threshold value and is being charged, but to demand at least the minimal power level from the PSE even when the battery is not being charged to ensure the constant availability of power from the PSE. For example, one or both connector hoods can include an appropriate POE circuit (such as may be included in POE powered devices) incorporated into and/or in communication with the circuit that provides the tracing functionality described in this disclosure. In other embodiments, the cable is not configured to maintain a minimal power demand from the PSE after the handshake is completed, such that the cable will fully charge the battery when plugged in, but then allow the PSE to stop delivering power once the battery is fully charged.

In some embodiments, the cable comprises a charging circuit coupled to the at least one of the conductor wire pairs (to which the POE resistor is coupled) and configured such that if the cable is electrically connected to POE PSE, the charging circuit can communicate electric current from the PSE to the power source (e.g., a rechargeable battery, a capacitor, etc.). In some embodiments, the POE resistor is included in a PCB to which the controller is coupled. In some embodiments, the controller is configured such that if the cable is electrically connected to POE PSE, the controller can direct electrical current from the PSE (or, more specifically, the POE PSE) to the battery (e.g., if the battery falls below a threshold voltage, such as, for example, 60% of the battery's rated voltage). In some embodiments, the controller is configured to only direct electrical current from the POE PSE if the battery is below the threshold voltage. In such embodiments, the circuit (e.g., similar to circuit 120) can include a suitable charging subcircuit, as is known in the art.

In some embodiments, a Radio Frequency Identification circuit, often called an RFID tag, replaces or supplements integrated circuit 82. The use of an RFID tag can, for example, store information about a device to which one or both ends of the cable is connected, such as, for example, one or more of: the Media Access Control address (MAC address), the jack number, port address, IP address, workstation identifier, server identifier, and/or the other information. The user can then use an RFID reader to scan an end of the networking cable to obtain information about the location at which the opposite end of the cable is coupled without having to physically search for the other end of the cable.

Figure 10A:
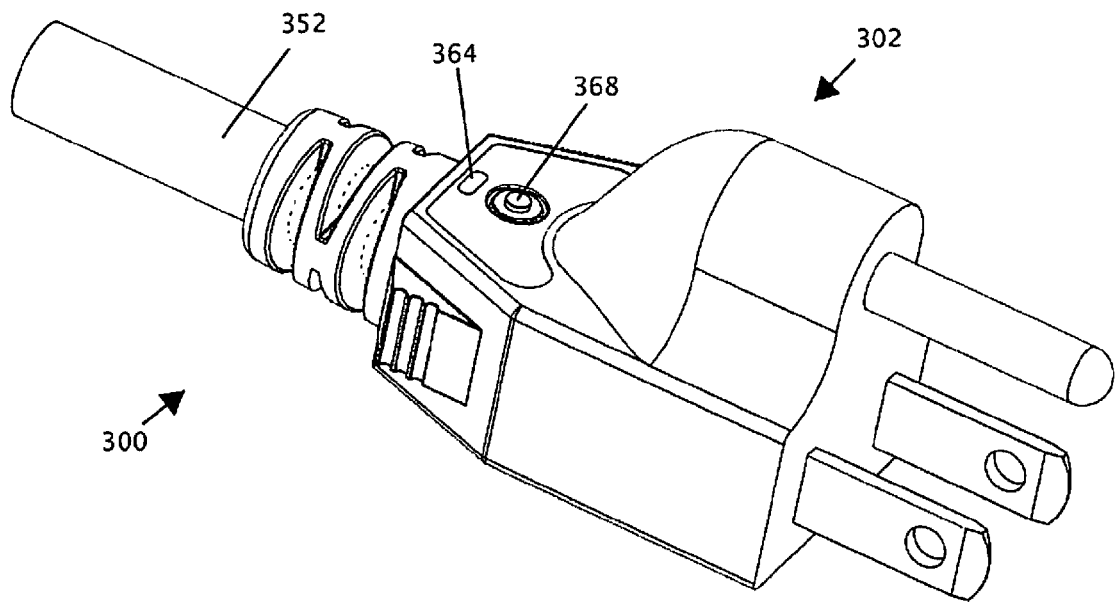
FIGS. 10A-10C are various views of one embodiment of a male connector for embodiments of the present power cables.
Figure 10B:
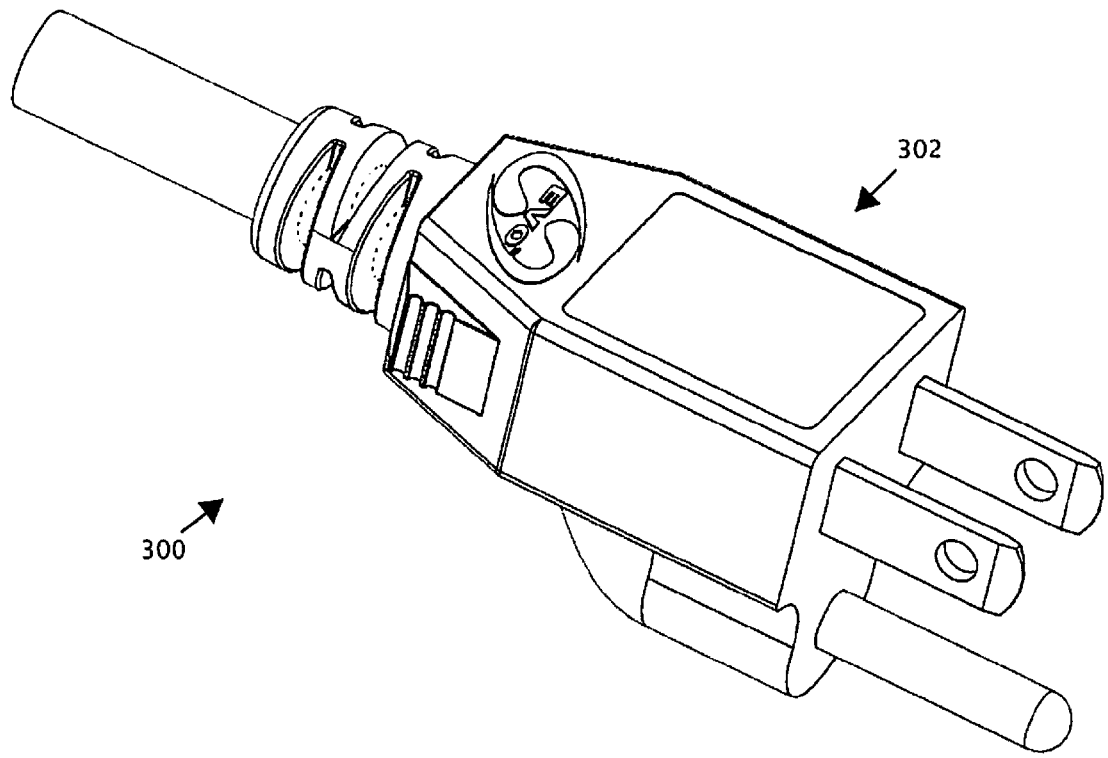
Figure 10C:
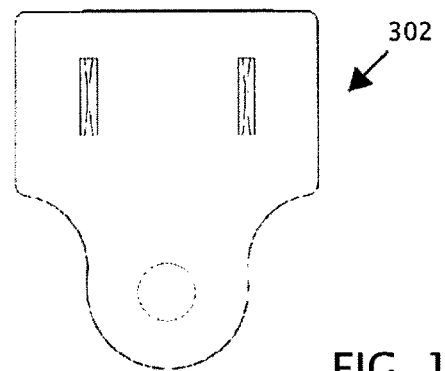
Figure 11A:
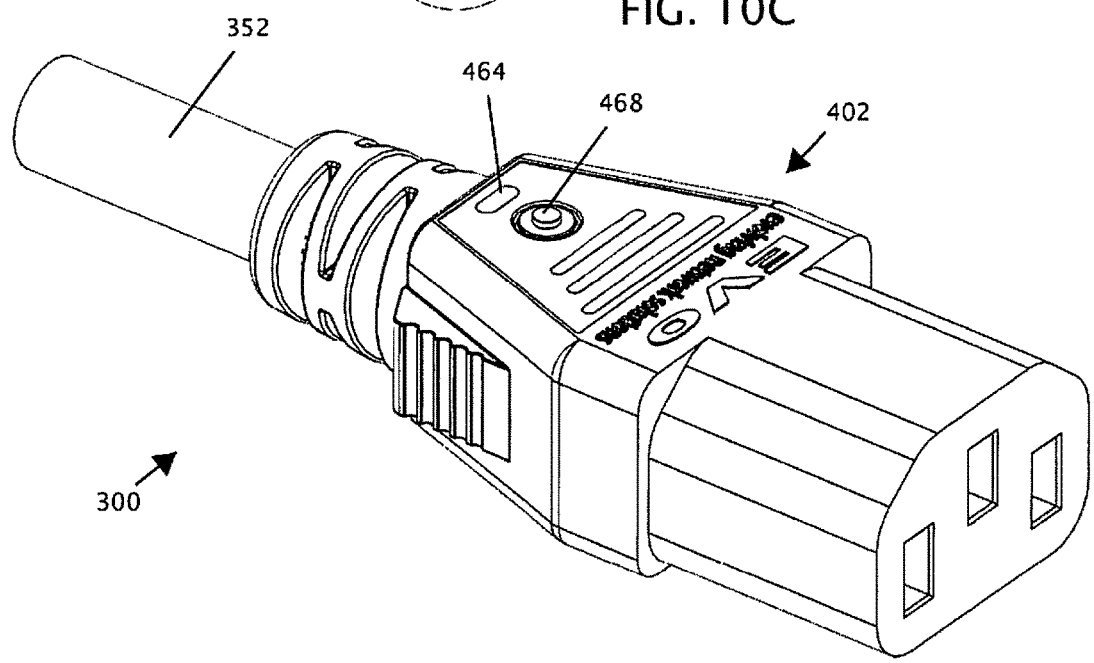
FIGS. 11A-11B are perspective and end views, respectively, of one embodiment of a female connector for embodiments of the present power cables.
Figure 11B:
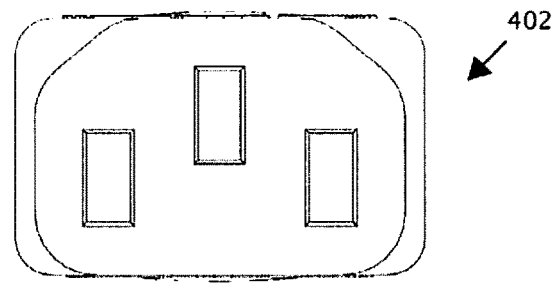

Referring now to FIGS. 10A-11B, shown there is an embodiment 300 of the present power cables. FIGS. 10A-10C depict various views of one embodiment 302 of a male connector hood cable 300; FIGS. 11A-11B depict perspective and end views, respectively, of one embodiment 402 of a female connector hood. In the embodiment shown, power cable 300 is configured to carry alternating current (AC) power (e.g., at 110V) from an external power source (e.g., a wall plug or outlet) to a powered device (e.g., a computer, a server, etc.). In the embodiment shown, the cable includes a male connector hood 302 at a first end that is configured to be connected to a standard grounded wall outlet (the plug includes two blades and a ground pin). Other embodiments may exclude the ground pin (e.g., have only two blades) such that the cable will not provide a grounded connection to the wall outlet. In the embodiment shown, cable 300 includes a female connector hood 402 at a second end that is configured (e.g., is configured to receive three blades, with the center blade vertically offset form the two outer blades as shown in FIG. 11B) to be connected to any of various devices (e.g., computer, server, printer, etc.). In the embodiment shown, cable 300 includes a power cable 352 with two or more conductors (e.g., three conductors, with one for ground) in a flexible outer sheath.

In the embodiment shown, male connector hood 302 includes an electrically activated telltale 364 (similar to telltale 64) and a button 468 (e.g., similar to button 68), both of which can function as described above for various embodiments. While not shown in FIGS. 10A-11B, the internal components (e.g., electric power source, manually operated switch, controller, PCB board, etc.) and functionality of cable 300 are similar to the internal components and functionality of the networking cables described above, with the primary exception that POE is not implemented over power cable 300 and, thus, the POE-specific functionality described above need not be included in embodiments of the present power cables. For example, power cable 352 can include one or more tracer or indicator conductors (e.g., a pair of indicator wires) running the length the cable (e.g., in addition to the power conductors in the cable). As another example, embodiments of power cable 300 can include a charging circuit (e.g., as described above) coupled to two or more of the power conductors in the power cable such that if the power cable is coupled to an external electrical power source (e.g., a wall plug, generator, etc.), the charging circuit can communicate electric current from the external electric power source to the power source (e.g., a controller in the power cable can be configured to direct electrical current from the external power source (e.g., via an AC-DC converter in or in communication with the circuit that provides the tracing function) to the battery if the voltage of the battery falls below a threshold voltage). As described above for boot 58, connector hoods 302 and 402 may be overmolded onto cable 352 in one or more pieces (e.g., a single piece or a boot and a connector).

Figure 12A:
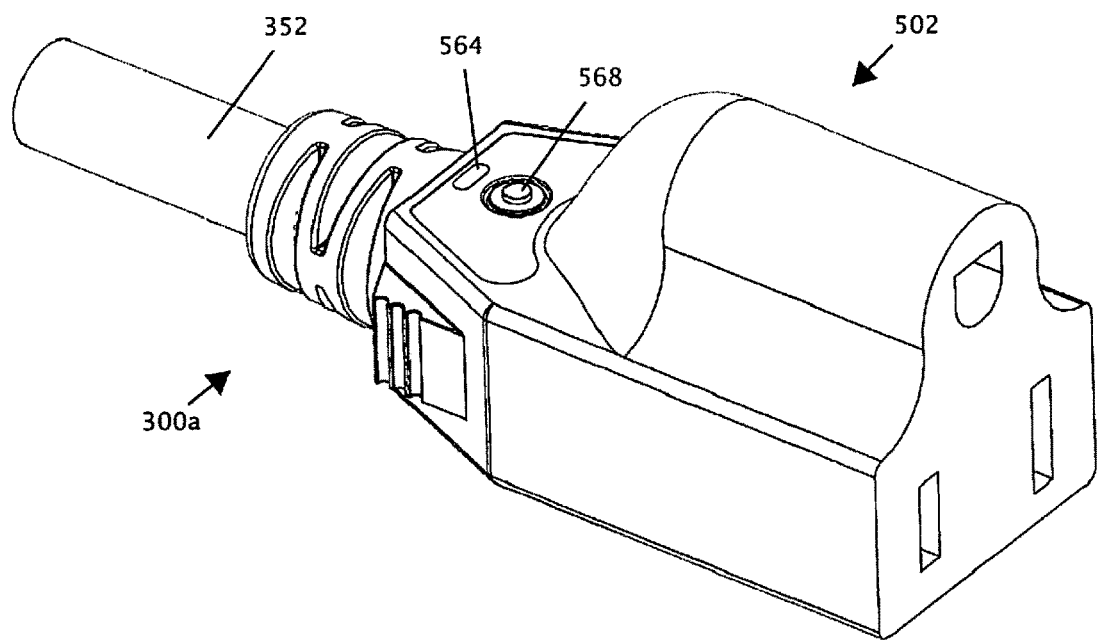
FIGS. 12A-12B are perspective and end views, respectively, of another embodiment of a female connector for embodiments of the present power cables.
Figure 12B:
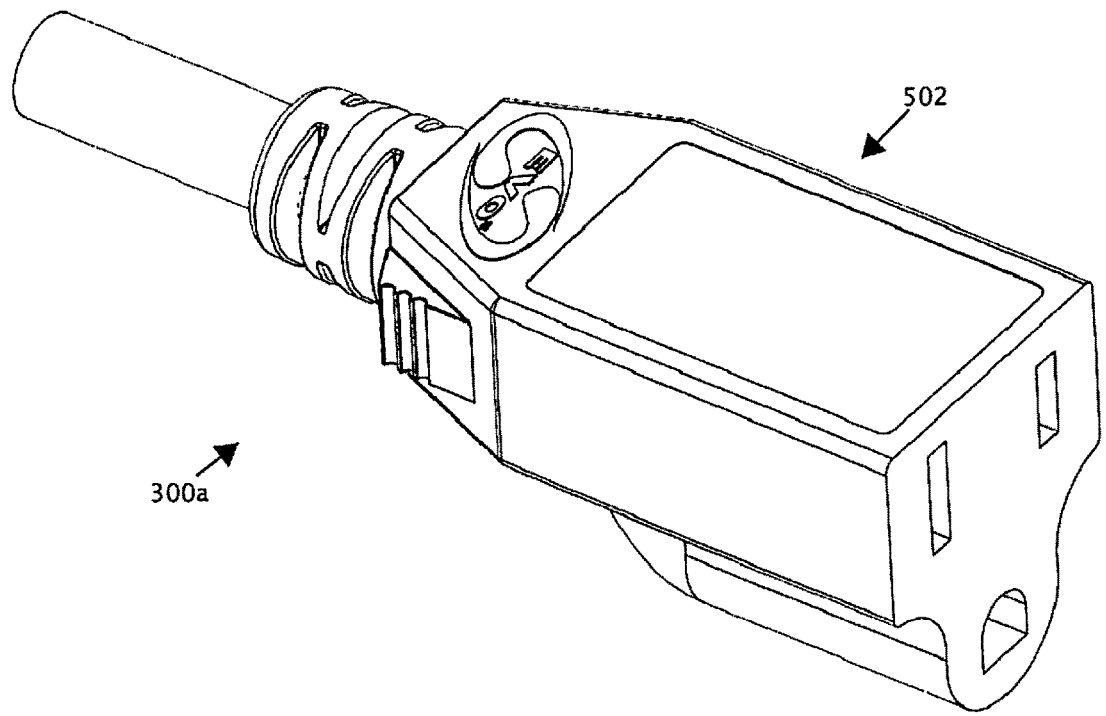

FIGS. 12A-12B depict perspective and end views, respectively, of another embodiment 502 of a female connector hood for embodiments of the present power cables. In the depicted alternate embodiment 300a of cable 352, connector hood 502 can be coupled to the second end of power cable 352 (e.g., in place of connector hood 402). As shown, female connector hood 502 is configured to receive a standard male connector. In the embodiment shown, female connector hood 502 is similar to female connector hood 402, with the primary exception being the physical configuration. For example, female connector hood 502 includes an electronically activated telltale 564 (similar to telltales 64, 364, 464) and a button 568 (similar to buttons 68, 368, 468), and any of the components and/or functions described above.

The above specification and examples provide a complete description of the structure and use of exemplary embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the present devices are not intended to be limited to the particular forms disclosed. Rather, they include all modifications and alternatives falling within the scope of the claims, and embodiments other than the one shown may include some or all of the features of the depicted embodiment. For example, components may be combined as a unitary structure (e.g., connector 56 and boot 58 may be formed as a unitary piece). Further, where appropriate, aspects of any of the examples described above may be combined with aspects of any of the other examples described to form further examples having comparable or different properties and addressing the same or different problems. Similarly, it will be understood that the benefits and advantages described above may relate to one embodiment or may relate to several embodiments.

The claims are not intended to include, and should not be interpreted to include, means-plus- or step-plus-function limitations, unless such a limitation is explicitly recited in a given claim using the phrase(s) "means for" or "step for," respectively.

The invention claimed is:

1. A power cable comprising:
    a cable having a first end, a second end, two or more power conductors in a flexible sheath between the first end and the second end, and one or more indicator wires in the flexible sheath between the first end and the second end;
    a male connector hood on the first end of the cable;
    two or more blades or pins extending from a mating end of the male connector hood, the two or more blades or pins each connected to one of the two or more power conductors of the cable;
    a female connector hood on the second end of the cable, the female connector hood including a mating end defining two or more recesses each configured to receive a single blade or pin in electrical communication with a single one of the two or more power conductors of the cable;
    an electric power source incorporated into at least one of the connector hoods, the electric power source comprising a battery;
    an electrically activated telltale incorporated into at least one of the connector hoods; and
    a manually operated switch incorporated into at least one of the connector hoods and configured to initiate electrical communication between the electric power source, the one or more indicator wires, and the electrically activated telltale.

2. The power cable of claim 1, further comprising a charging circuit coupled to the two or more conductors and configured such that if the power cable is coupled to an external electric power source, the charging circuit can communicate electric current from the external electric power source to the power source.

3. The power cable of claim 1, further comprising:
    a second electrically activated telltale incorporated into the other of the connector hoods;

where the manually operated switch is configured to activate both electrically activated telltales by initiating electrical communication between the electric power source, the one or more indicator wires, and the electrically activated telltale.

4. The power cable of claim 1, further comprising:
a controller coupled to the electric power source, the manually operated switch, and the electrically activated telltale.

5. The power cable of claim 4, where the controller is configured to:
activate the electrically activated telltale for a predetermined amount of time responsive to the manually operated switch being operated if the electrically activated telltale is not active; and
inactivate the electrically activated telltale responsive to the manually operated switch being operated during a predetermined amount of time in which the electrically activated telltale is activated.

6. The power cable of claim 4, where the controller is configured to:
activate the electrically activated telltale for a first predetermined amount of time responsive to the manually operated switch being operated in a first manner if the electrically activated telltale is not active; and
activate the electrically activated telltale for a second predetermined amount of time responsive to the manually operated switch being operated in a second manner if the electrically activated telltale is not active.

7. The power cable of claim 4, where the electrically activated telltale is in a deactivated state, and the controller is configured to activate the electrically activated telltale if the voltage of the battery falls below a threshold voltage.

8. The power cable of claim 4, where the controller is configured such that if the power cable is coupled to an external electric power source, the controller can direct electrical current from the external power source to the battery.

9. The power cable of claim 8, where the controller is configured to direct electrical current from the external power source to the battery if the voltage of the battery falls below a threshold voltage.

10. A networking cable comprising:
a plurality of conductors in a flexible sheath having a first end and a second end, the plurality of conductors comprising a plurality of conductor wire pairs;
a connector hood on each end of the flexible sheath;
an electric power source incorporated into at least one of the connector hoods, the electric power source comprising a battery;
an electrically activated telltale incorporated into at least one of the connector hoods;
a manually operated switch incorporated into at least one of the connector hoods and configured to initiate electrical communication between the electric power source and the electrically activated telltale; and
a resistor incorporated into at least one of the connector hoods, the resistor electrically connected to at least one of the conductor wire pairs such that if the networking cable is electrically connected to power-over-Ethernet (POE) power sourcing equipment (PSE), the POE PSE will continuously deliver electric power to the networking cable if the networking cable is not also electrically connected to a separate POE powered device (PD).

11. The networking cable of claim 10, where the plurality of conductors further comprises at least one indicator wire, and the manually operated switch is configured to initiate electrical communication between the electric power source and the electrically activated telltale via the at least one indicator wire.

12. The networking cable of claim 10, further comprising a charging circuit coupled to the at least one of the conductor wire pairs and configured such that if the plurality of conductors is electrically connected to POE PSE, the charging circuit can communicate electric current from the POE PSE to the battery.

13. The networking cable of claim 10, where the battery comprises a rechargeable battery.

14. The networking cable of claim 10, further comprising:
a second electrically activated telltale incorporated into another of the connector hoods;
where the manually operated switch is configured to initiate activation of both electrically activated telltales via electrical communication between the electric power source, at least one of the conductors, and the electrically activated telltale.

15. The networking cable of claim 10, further comprising:
a controller coupled to the electric power source, the manually operated switch, and the electrically activated telltale.

16. The networking cable of claim 10, further comprising a controller configured to:
activate the electrically activated telltale for a predetermined amount of time responsive to the manually operated switch being operated if the electrically activated telltale is not active; and
inactivate the electrically activated telltale responsive to the manually operated switch being operated during a predetermined amount of time in which the electrically activated telltale is activated.

17. The networking cable of claim 10, where the electrically activated telltale is in a deactivated state, and further comprising a controller configured to cause the electrically activated telltale to flash for a first predetermined amount of time responsive to detection of activation of the manually operated switch for at least a second predetermined amount of time when the electrically activated telltale is in the deactivated state.

18. The networking cable of claim 10, further comprising a controller configured to, responsive to activation of the manually operated switch, electrically couple activate the electrically activated telltale, via the battery, independent of the plurality of conductors being coupled to POE PSE, a POE PD, or both the POE PSE and the POE PD.

19. The networking cable of claim 10, further comprising a controller configured to:
detect an activation characteristic of the manually operated switch, the activation characteristic comprising a switch activation operation, a duration of a switch activation operation, a sequence of consecutive switch activation operations, or a combination thereof;
identify a state of the electrically activated telltale; and
select a telltale operation based on the activation characteristic and the state.

20. The networking cable of claim 10, further comprising a controller configured to:
cause the electrically activated telltale to flash responsive to detection of a number of consecutive activations of the manually operated switch when the electrically activated telltale is in a deactivated state; and
cause the electrically activated telltale to transition to the deactivated state responsive to detection of activation of the manually operated switch when the electrically activated telltale is in an active state.

\* \* \* \* \*